(12) United States Patent
Moon et al.

(10) Patent No.: US 10,294,341 B2
(45) Date of Patent: May 21, 2019

(54) THERMOSETTING RESIN COMPOSITION FOR SEMICONDUCTOR PACKAGE AND PREPREG USING THE SAME

(71) Applicant: LG CHEM, LTD., Seoul (KR)

(72) Inventors: Hwa Yeon Moon, Daejeon (KR); Yong Seon Hwang, Daejeon (KR); Hee Yong Shim, Daejeon (KR); Hyun Sung Min, Daejeon (KR); Mi Seon Kim, Daejeon (KR); Chang Bo Shim, Daejeon (KR); Young Chan Kim, Daejeon (KR); Seung Hyun Song, Daejeon (KR); Won Ki Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/572,390

(22) PCT Filed: Dec. 28, 2016

(86) PCT No.: PCT/KR2016/015418
§ 371 (c)(1),
(2) Date: Nov. 7, 2017

(87) PCT Pub. No.: WO2017/122952
PCT Pub. Date: Jul. 20, 2017

(65) Prior Publication Data
US 2018/0148555 A1 May 31, 2018

(30) Foreign Application Priority Data

Jan. 13, 2016 (KR) ........................ 10-2016-0004390

(51) Int. Cl.
| | |
|---|---|
| *C08K 9/06* | (2006.01) |
| *C08J 5/24* | (2006.01) |
| *C08L 33/08* | (2006.01) |
| *C08L 33/24* | (2006.01) |
| *C08L 63/00* | (2006.01) |
| *H01L 23/29* | (2006.01) |
| *C08L 65/02* | (2006.01) |
| *H01L 23/14* | (2006.01) |
| *H01L 23/00* | (2006.01) |
| *C08L 61/14* | (2006.01) |
| *H01L 23/373* | (2006.01) |
| *H01L 23/42* | (2006.01) |

(52) U.S. Cl.
CPC ................. *C08J 5/24* (2013.01); *C08K 9/06* (2013.01); *C08L 33/08* (2013.01); *C08L 33/24* (2013.01); *C08L 61/14* (2013.01); *C08L 63/00* (2013.01); *C08L 65/02* (2013.01); *H01L 23/145* (2013.01); *H01L 23/29* (2013.01); *H01L 23/562* (2013.01); *C08G 2261/135* (2013.01); *C08G 2261/142* (2013.01); *C08G 2261/143* (2013.01); *C08G 2261/1414* (2013.01); *C08G 2261/3424* (2013.01); *C08G 2261/76* (2013.01); *C08J 2365/02* (2013.01); *C08J 2433/00* (2013.01); *C08J 2463/00* (2013.01); *C08J 2479/08* (2013.01); *H01L 23/3735* (2013.01); *H01L 23/3737* (2013.01); *H01L 23/42* (2013.01)

(58) Field of Classification Search
CPC .... C08J 5/24; C08K 9/06; C08L 33/08; C08L 33/24; C08L 61/18; C08L 63/00; C08L 61/14; C08L 65/02
See application file for complete search history.

(56) References Cited

U.S. PATENT DOCUMENTS

| | | | | |
|---|---|---|---|---|
| 9,278,505 | B2* | 3/2016 | Shim | B32B 17/04 |
| 9,296,928 | B2* | 3/2016 | Shin | C09J 161/06 |
| 2006/0135653 | A1* | 6/2006 | Zarnoch | C08L 71/126 |
| | | | | 523/205 |
| 2006/0173101 | A1 | 8/2006 | Takahata et al. | |
| 2007/0088134 | A1* | 4/2007 | Suzuki | C08G 18/10 |
| | | | | 525/421 |
| 2011/0048776 | A1 | 3/2011 | Qiang et al. | |
| 2011/0083890 | A1 | 4/2011 | Tanaka et al. | |
| 2012/0184646 | A1 | 7/2012 | Sumita et al. | |
| 2014/0199549 | A1 | 7/2014 | Shin et al. | |
| 2015/0075852 | A1 | 3/2015 | Inoue et al. | |
| 2015/0090922 | A1* | 4/2015 | Hatakeyama | C09K 5/14 |
| | | | | 252/74 |
| 2016/0017141 | A1 | 1/2016 | Matsumoto et al. | |
| 2016/0369099 | A1* | 12/2016 | Moon | C08L 79/04 |
| 2017/0022356 | A1 | 1/2017 | Yamazawa et al. | |

FOREIGN PATENT DOCUMENTS

| | | | |
|---|---|---|---|
| JP | 02-124924 | A | 5/1990 |
| JP | 02-219853 | A | 9/1990 |
| JP | 06-082916 | B2 | 10/1994 |
| JP | 07-300577 | A | 11/1995 |
| JP | 08-059796 | A | 3/1996 |
| JP | 08-151462 | A | 6/1996 |
| JP | 08-231738 | A | 9/1996 |
| JP | 3620425 | B2 | 2/2005 |
| JP | 3620426 | B2 | 2/2005 |
| JP | 2005-068258 | A | 3/2005 |
| JP | 2005-325210 | A | 11/2005 |
| JP | 4000754 | B2 | 10/2007 |
| JP | 2011-202140 | A | 10/2011 |
| JP | 4888147 | B2 | 2/2012 |
| JP | 2012-149111 | A | 8/2012 |
| JP | 2012-153752 | A | 8/2012 |
| JP | 2015-224304 | A | 12/2015 |
| JP | 2016529371 | A | 9/2016 |

(Continued)

*Primary Examiner* — Hannah J Pak
(74) *Attorney, Agent, or Firm* — Dentons US LLP

(57) ABSTRACT

The present invention relates to a thermosetting resin composition for a semiconductor package and a prepreg using the same. Specifically, a thermosetting resin composition for a semiconductor package which exhibits a low curing shrinkage ratio and has a high glass transition temperature and greatly improved flowability by introducing acrylic rubber and mixing two specific inorganic fillers surface-treated with a binder of a specific composition at a certain ratio, and a prepreg using the same, are provided.

12 Claims, No Drawings

(56) References Cited

FOREIGN PATENT DOCUMENTS

| | | |
|---|---|---|
| KR | 10-2005-0107608 A | 11/2005 |
| KR | 10-0722814 B1 | 5/2007 |
| KR | 10-2014-0037238 A | 3/2014 |
| KR | 10-2015-0037568 A | 4/2015 |
| KR | 10-2015-0037685 A | 4/2015 |
| WO | 2006-023860 A2 | 3/2006 |
| WO | 2014-132654 A1 | 9/2014 |
| WO | 2014-133991 A1 | 9/2014 |
| WO | 2015046921 A | 4/2015 |
| WO | 2015-079708 A | 3/2017 |

* cited by examiner

THERMOSETTING RESIN COMPOSITION FOR SEMICONDUCTOR PACKAGE AND PREPREG USING THE SAME

CROSS-REFERENCE TO RELATED APPLICATION(S)

This application is a National Stage Entry of International Application No. PCT/KR2016/015418 filed on Dec. 28, 2016, and claims the benefit of Korean Application No. 10-2016-0004390 filed on Jan. 13, 2016, all of which are hereby incorporated by reference in their entirety for all purposes as if fully set forth herein.

TECHNICAL FIELD

The present invention relates to a thermosetting resin composition for a semiconductor package capable of producing a prepreg and a metal foil laminate exhibiting excellent physical properties even after a reflow process of a printed circuit board (PCB), and a prepreg using the same.

BACKGROUND OF ART

A copper clad laminate used for a conventional printed circuit board is prepared by impregnating a base material of a glass fabric into a varnish of the thermosetting resin and semi-curing it to make a prepreg, and then heating and pressing it together with a copper foil. The prepreg is used again for constructing a circuit pattern on such copper foil laminate and again building-up thereon.

However, as electronic equipment becomes thinner and lighter, a phenomenon where the package becomes warped is generated due to the thinness and the high density of the semiconductor package.

Such warpage phenomenon is exacerbated by a phenomenon in which the sub-substrate itself is not restored while repeating high temperatures in the PCB reflow process. Therefore, due to the above-mentioned problem, there is a demand for a product having a low hardening shrinkage ratio and securing the flowability even if it is processed at a high temperature.

However, thermosetting resin compositions suitable for the PCB reflow process have not yet been developed.

DETAILED DESCRIPTION OF THE INVENTION

Technical Problem

For resolving the aforesaid problems of the prior arts, it is an object of the present invention to provide a thermosetting resin composition for a semiconductor package capable of producing a prepreg and a metal foil laminate having improved flowability, low shrinkage and high glass transition temperature characteristics, thereby exhibiting excellent mechanical properties when applied to a reflow process of a printed circuit board (PCB reflow).

It is another object of the present invention to provide a prepreg using the above-mentioned thermosetting resin composition.

Technical Solution

In order to achieve these objects, the present invention provides a thermosetting resin composition for a semiconductor package including:

5 to 20 parts by weight of an acrylic rubber and 160 to 350 parts by weight of a filler, based on 100 parts by weight of a binder including an epoxy resin, a bismaleimide resin, a cyanate resin and a benzoxazine resin, wherein the acrylic rubber has physical properties such as a weight average molecular weight of $30 \times 10^4$ to $65 \times 10^4$, a viscosity of 1,000 to 6,000 mPa·s, and a glass transition temperature of 10° C. to 50° C., the filler is at least one mixture including a first inorganic filler having an average particle diameter of 0.2 μm to 1 μm in which a (meth)acrylate silane compound is bonded to the surface of the filler, and a second inorganic filler having an average particle diameter of 20 nm to 50 nm in which a (meth)acrylate silane compound is bonded to the surface of the filler.

The acrylic rubber is an acrylic acid ester copolymer containing a repeating unit derived from butyl acrylate and a repeating unit derived from acrylonitrile; or an acrylic acid ester copolymer containing a repeating unit derived from butadiene.

Further, the acrylic rubber may further include a repeating unit derived from an alkyl acrylate having a linear or branched alkyl group having 2 to 10 carbon atoms.

The binder may include 20% to 60% by weight of an epoxy resin, 20% to 70% by weight of a bismaleimide resin, 30% to 70% by weight of a cyanate resin, and 2% to 10% by weight of a benzoxazine resin.

The benzoxazine resin may be at least one selected from the group consisting of a bisphenol A-type benzoxazine resin, a bisphenol F-type benzoxazine resin, a phenolphthalein benzoxazine resin, and a mixture of these benzoxazine resins and a curing accelerator.

The inorganic filler may be at least one selected from the group consisting of silica aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, fine glass powder, and hollow glass.

Further, the filler may be at least one mixture including an inorganic filler compound having an average particle diameter of 20 nm to 50 nm in which a (meth)acrylate silane compound is bonded to the surface and an inorganic filler having an average particle diameter of 0.2 μm in which a (meth)acrylate silane compound is bonded to the surface.

The epoxy resin may be at least one selected from the group consisting of a bisphenol A-type epoxy resin, a phenol novolac epoxy resin, a tetraphenyl ethane epoxy resin, a naphthalene-type epoxy resin, a biphenyl-type epoxy resin, a dicyclopentadiene epoxy resin, and a mixture of a dicyclopentadiene-type epoxy resin and a naphthalene-type epoxy resin.

The bismaleimide resin may be at least one selected from the group consisting of compounds represented by the following Chemical Formula 2.

[Chemical Formula 2]

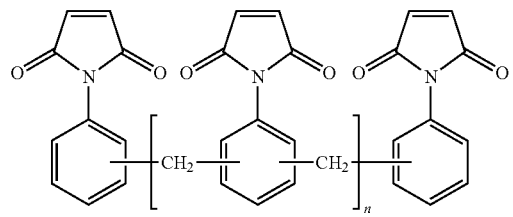

(wherein, n is an integer of 0 or 1 to 50)

The cyanate ester resin may be at least one selected from the group consisting of compounds represented by the following Chemical Formula 3."

[Chemical Formula 3]

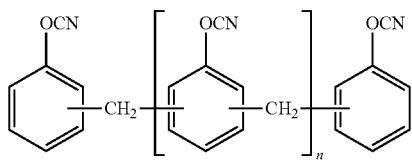

(wherein, n is an integer of 0 or 1 to 50)

The thermosetting resin composition may further include at least one additive selected from the group consisting of a solvent, a curing accelerator, a flame retardant, a lubricant, a dispersant, a plasticizer and a silane coupling agent.

In addition, according to another embodiment of the present invention, a prepreg obtained by impregnating a fiber substrate with the thermosetting resin composition is provided.

Advantageous Effects

The present invention provides a thermosetting resin composition for a semiconductor package which exhibits low curing shrinkage and has a high glass transition temperature and greatly improved flowability by introducing acrylic rubber and mixing two specific inorganic fillers surface-treated with a binder of a specific composition at a certain ratio.

Further, the present invention provides a prepreg as a build-up material that can be applied to a micropatterned printed circuit board by securing excellent flowability of the prepreg.

In addition, the thermosetting resin composition of the present invention not only exhibits physical properties equal to or higher than those of the conventional resin composition but also has excellent flowability, thereby improving reliability.

Detailed Description of the Embodiments

Hereinafter, preferred embodiments of the present invention will be described in more detail. It should be understood that the terms or words used in the specification and the appended claims should not be construed as limited to general and dictionary meanings, but are to be interpreted based on the meanings and concepts corresponding to technical aspects of the present invention on the basis of the principle that the inventor is allowed to define the concept of the terms appropriately for the best explanation.

Further, the term "include" or "comprise" used in the present specification is to specify a specific property, region, integer, step, operation, element, and/or component, but does not exclude the presence or addition of another specific property, region, integer, step, operation, element and/or component.

According to one embodiment of the present invention, a thermosetting resin composition for a semiconductor package including: 5 to 20 parts by weight of an acrylic rubber and 160 to 350 parts by weight of a filler, based on 100 parts by weight of a binder including an epoxy resin, a bismaleimide resin, a cyanate resin, and a benzoxazine resin, wherein the acrylic rubber has physical properties such as a weight average molecular weight of $30 \times 10^4$ to $65 \times 10^4$, a viscosity of 1000 to 6000 mPa·s, and a glass transition temperature of 10° C. to 50° C., the filler is at least one mixture including a first inorganic filler having an average particle diameter of 0.2 μm to 1 μm in which a (meth)acrylate silane compound is bonded to the surface, and a second inorganic filler having an average particle diameter of 20 nm to 50 nm in which a (meth)acrylate silane compound is bonded to the surface, is provided.

The thermosetting resin composition of the present invention can exhibit low shrinkage characteristics even when a filler is used in a large amount, by using an acrylic rubber having specific parameter properties. Further, in the present invention, not only an epoxy resin but also a cyanate ester resin is used in the resin composition to exhibit physical properties of a high glass transition temperature, and it is possible to cure bismaleimide (BMI) using a benzoxazine resin instead of a phenol curing agent and the resin flowability can be improved.

Further, the present invention can increase the flowability of the prepreg by using two types of fillers that are different in particle size and are surface-treated with an acrylic compound together with the acrylic rubber. Furthermore, when the surface-treated filler is used, the present invention can increase the filling rate by increasing the packing density by using both a small size as a nanoparticle size and a large size as a microparticle size.

Accordingly, the thermosetting resin composition of the present invention can produce a prepreg which maintains excellent physical properties without warpage even when high temperatures are repeated in the PCB reflow process. In addition, since many reactions do not occur in the drying process made into the prepreg, it is possible to secure a flowability during preparation or build-up of a metal laminate, thereby easily filling a fine pattern. The metal laminate including the prepreg may be usefully used for the build-up of printed circuit boards for semiconductor packages. In addition, in the case of the present invention, it can be applied for the preparation of a double-sided printed circuit board and also a multilayer printed circuit board using the resin composition.

Hereinafter, the components of the thermosetting resin composition according to one preferred embodiment of the present invention and the prepreg using the resin composition will be described in more detail.

First, the thermosetting resin composition of the present invention includes a binder containing an epoxy resin and a special resin, a rubber component and a filler. The special resin includes a bismaleimide resin, a cyanate resin and a benzoxazine resin, and an acrylic rubber is used as the rubber component.

Considering the physical properties required for the thermosetting resin composition as a mixture of an epoxy resin, a bismaleimide resin, a cyanate resin and a benzoxazine resin, the binder component can be used by suitably adjusting the content thereof so that the entire resin mixture becomes 100% by weight.

For example, based on the total weight of the entire binder, 20% to 60% by weight of an epoxy resin, 20% to 70% by weight of a bismaleimide resin, 30% to 70% by weight of a cyanate resin and 2% to 10% by weight of a benzoxazine resin can be included.

In addition, the filler may include a certain amount of two types of inorganic fillers having different particle sizes in which a (meth) acrylate silane compound is bonded to the surface.

Each of these components will be described.

<Thermosetting Resin Composition>

Epoxy Resin

As the above epoxy resin, those usually used for a thermosetting resin composition for a prepreg can be used, and the type of the epoxy resin is not limited.

The epoxy resin used may include, for example, at least one selected from the group consisting of a bisphenol A-type epoxy resin, a phenol novolac epoxy resin, a tetraphenyl ethane epoxy resin, a naphthalene-type epoxy resin, a biphenyl-type epoxy resin, a dicyclopentadiene epoxy resin of the following Chemical Formula 1, and a mixture of a dicyclopentadiene-type epoxy resin and a naphthalene-type epoxy resin.

[Chemical Formula 1]

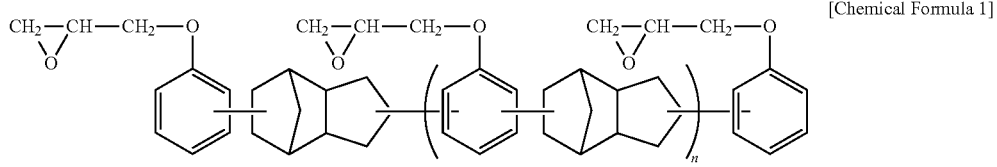

(wherein, n is an integer of 0 or 1 to 50)

The epoxy resin can be used in an amount of 20% to 60% by weight based on the total weight of the entire binder. If the amount of the epoxy resin used is less than 20% by weight, there is a problem that it is difficult to achieve a high Tg, and if it exceeds 60% by weight, there is a problem that the flowability is deteriorated.

Bismaleimide Resin

The bismaleimide resin may be at least one selected from the group consisting of compounds represented by the following general Chemical Formula 2:

[Chemical Formula 2]

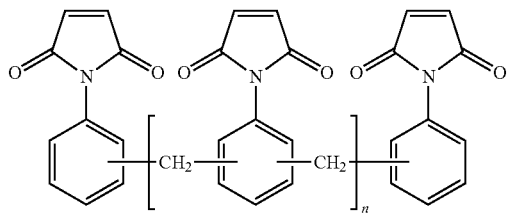

(wherein, n is an integer of 0 or 1 to 50)

As a preferred example, the bismaleimide resin may be at least one selected from the group consisting of a diphenylmethane bismaleimide resin, a phenylene bismaleimide resin, a bisphenol A-type diphenyl ether bismaleimide resin, and a bismaleimide resin composed of oligomers of a phenylmethane maleimide resin.

The bismaleimide resin may be used in an amount of 20% to 70% by weight based on the total weight of the entire binder. When the amount of the bismaleimide resin used is less than 20% by weight, there is a problem that desired physical properties cannot be achieved. When the amount of the bismaleimide resin is more than 70% by weight, there are many unreacted groups which adversely affect characteristics such as chemical resistance.

Cyanate Resin

The cyanate resin may be at least one selected from the group consisting of compounds represented by the following Chemical Formula 3.

As a preferable example, the cyanate resin may be at least one selected from the group consisting of a bisphenol-type cyanate resin such as a novolac-type cyanate resin, a bisphenol A-type cyanate resin, a bisphenol E-type cyanate resin, a tetramethyl bisphenol F-type cyanate resin, and their partially-triazinated prepolymers. One alone or two or more of these may be used here as combined.

[Chemical Formula 3]

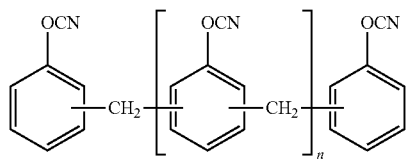

(wherein, n is an integer of 0 or 1 to 50)

The cyanate resin may be used in an amount of 30% to 70% by weight based on the total weight of the entire binder. If the amount of the cyanate resin used is less than 30% by weight, it is difficult to realize a high Tg. If the amount of the cyanate resin is more than 70% by weight, it may adversely affect chemical resistance such as desmearing and gas generation is increased.

Benzoxazine Resin

In the present invention, the reaction rate can be controlled by changing the phenol novolac used as a conventional curing agent to a benzoxazine resin.

That is, the phenol novolac curing agent, which has been mainly used in the past, generally has a hydroxyl group in its own structure and reacts with epoxy resin and the like at room temperature, and thus the initial reaction rate is fast. On the other hand, the benzoxazine resin used in the present invention acts as a curing agent and so has a property of generating a hydroxyl group at a temperature of 150° C. or higher.

As a result, the reaction occurs slowly at room temperature or at an early stage, but it is possible to regulate the reaction rate by participating in the reaction at a predetermined temperature or higher.

Accordingly, the benzoxazine resin used in the present invention can control the reaction rate, thereby ensuring the flowability of the prepreg. In addition, the benzoxazine enables curing of the above-mentioned epoxy resin and bismaleimide resin.

That is, the benzoxazine resin can be used as a curing agent for the epoxy resin and the bismaleimide resin.

Thus, unlike the conventional phenol novolac resin, as the benzoxazine resin is used as a curing agent for the bismaleimide resin, the curing reaction of the resins that can be carried out even at a low temperature, such as the drying process, occurs less, and the curing degree of the prepreg is lowered, thereby ensuring flowability.

This provides the effect of minimizing appearance defects occurring in the process of manufacturing the metal laminate as well as in the press process used in the build-up process.

Such a benzoxazine resin may be at least one selected from the group consisting of a bisphenol A-type benzoxazine resin, a bisphenol F-type benzoxazine resin, a phenolphthalein benzoxazine resin, and a mixture of these benzoxazine resins and some curing accelerator.

The benzoxazine resin may be used in an amount of 2% to 10% by weight or less based on the total weight of the entire binder so that sufficient curing of the bismaleimide resin contained in the binder can be induced.

At this time, when the benzoxazine resin is contained in an excess amount, the curing reaction rate during the preparation of the prepreg may be delayed more than necessary and the process efficiency may be lowered.

Accordingly, the benzoxazine resin is preferably contained in an amount of 10% by weight or less based on the total weight of the binder.

However, if the content is too small, the effect as a desired curing agent cannot be exhibited, and thus the chemical resistance and Tg cannot be improved. In this regard, it is preferable to use the benzoxazine resin within the above-mentioned range.

Acrylic Rubber

The acrylic rubber of the present invention can be contained in the resin composition to exhibit low curing shrinkage characteristics. In addition, the acrylic rubber can further enhance the expansion relaxing function.

The acrylic rubbers used herein are those having a molecular structure in which the acrylic acid ester copolymer has rubber elasticity.

Specifically, the acrylic rubber is an acrylic acid ester copolymer containing a repeating unit derived from butyl acrylate and a repeating unit derived from acrylonitrile; or an acrylic acid ester copolymer containing a repeating unit derived from butadiene.

Further, the acrylic rubber may further include a repeating unit derived from an alkyl acrylate having a linear or branched alkyl group having 2 to 10 carbon atoms.

The preparation method of the acrylic rubber is not limited, and it can be obtained by performing suspension polymerization in a solvent using a monomer having the above repeating unit to prepare an acrylic ester copolymer having a functional group. In addition, the acrylic rubber may have a relatively narrow molecular weight distribution.

The acrylic rubber may have physical properties such as a weight average molecular weight of $30 \times 10^4$ to $65 \times 10^4$, a viscosity of 1,000 to 6,000 mPa·s and a glass transition temperature of 10° C. to 50° C. At this time, if the physical properties of the acrylic rubber are out of the above range, the flowability may be insufficient and thus the pattern may not be filled.

The acrylic rubber may be used in an amount of 5 to 20 parts by weight or 10 to 20 parts by weight based on 100 parts by weight of the binder. If the amount of the acrylic rubber is less than 5 parts by weight, there is a problem that low shrinkage property is not exhibited. If the amount is more than 20 parts by weight, the flowability may be deteriorated.

Filler

In the present invention, the uniformity of the resin composition can be improved by using two kinds of fillers that have been surface-treated by a specific material with high uniformity without using the conventional general fillers.

The filler used in the thermosetting resin composition has different compatibility with the resin depending on the surface treatment, and the better the compatibility with the resin, the more the flowability is secured. Further, when the type of the curing agent is specifically changed so that the reaction between the resins occurs slowly, the flowability is secured.

Preferably, the filler may be an inorganic filler in which a (meth)acrylate silane compound is bonded to the surface, and both a slurry type and a powder type can be used.

Further, the inorganic filler may be at least one selected from the group consisting of silica aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, fine glass powder, and hollow glass.

Particularly, the present invention is characterized in that, when the surface-treated filler above is used, only one type of filler is not used, but two types of inorganic fillers having different particle sizes are mixed and used.

Specifically, the present invention may increase the filling rate by increasing the packing density by using a small size of a nanoparticle size together with a large size of a micro particle size. Therefore, according to the present invention, because the thermosetting resin composition exhibits a higher filling rate than in the case of using a conventional filler having a single particle diameter, the compatibility with the resin may be increased, and accordingly, the condition for optimal flowability of the prepreg may be secured.

According to the method of the present invention, as for the filler, it is preferable to use at least one mixture including a first inorganic filler having an average particle diameter of 0.2 μm to 1 μm in which a (meth) acrylate silane compound is bonded to the surface of the filler and a second inorganic filler having an average particle diameter of 20 nm to 50 nm in which a (meth) acrylate silane compound is bonded to the surface of the filler.

When the filler having a different average particle size is used, the first inorganic filler having an average particle diameter of 0.2 μm to 1 μm and the second inorganic filler having an average particle diameter of 20 nm to 50 nm may be used by mixing at a weight ratio of 10:90 to 90:10 or 70:30 to 90:10 based on the total weight of the entire surface-treated filler. Most preferably, the first inorganic filler and the second inorganic filler may be used by mixing at a weight ratio of 90:10 or 80:20 based on the total weight of the entire surface-treated filler.

According to a preferred embodiment of the present invention, the filler may be silica in which a (meth) acrylate silane compound is bonded to the surface.

The method of surface treating the first inorganic filler and the second inorganic filler may include a method of treating silica particles having different particle diameters via a dry or wet process by using a (meth) acrylate silane compound as a surface treatment agent. For example, the silica may be used by subjecting it to a surface treatment via a wet method using 0.01 to 1 part by weight of (meth) acrylate silane based on 100 parts by weight of silica particles. Herein, the first inorganic filler and the second inorganic filler may be, each independently or identically to each other, a slurry type or powder type. In addition, the silica particles may be used by surface treating those having an average particle diameter of 0.2 μm to 1 μm and those having an average particle diameter of 20 nm to 50 nm in a weight ratio of 90:10 or 80:20.

The filler may be used in an amount of 160 to 350 parts by weight or 250 to 350 parts by weight based on 100 parts by weight of the binder. If the content of the filler is less than about 160 parts by weight, the coefficient of thermal expansion increases which causes warpage due to heat after a semiconductor chip has been mounted after the manufacture of a substrate. If the content exceeds 350 parts by weight, the flowability of the prepreg is decreased, which may be problematic.

On the other hand, the thermosetting resin composition according to one embodiment of the present invention may further include at least one additive selected from the group consisting of a solvent, a curing accelerator, a flame retardant, a lubricant, a dispersant, a plasticizer and a silane coupling agent.

Specifically, in the present invention, a solvent can be added to the resin composition and used as a solution, as needed. The solvent is not particularly limited in its type as long as it exhibits good solubility with respect to the resin component, and alcohols, ethers, ketones, amides, aromatic hydrocarbons, esters, nitriles and the like may be used. Further, they may be used alone or in a mixed solvent of two or more thereof. Furthermore, the content of the solvent is not particularly limited as long as it can impregnate the resin composition in glass fiber during preparation of the prepreg.

The curing accelerator may be used for the purpose of accelerating the curing of the binder described above. The type or mixing ratio of the curing accelerator is not particularly limited, and for example, an imidazole-based compound, an organophosphorous compound, a tertiary amine, a quaternary ammonium salt and the like may be used, and two or more thereof may be used in combination. Preferably, the present invention uses an imidazole-based compound as the curing accelerator. When the imidazole-based curing accelerator is used, the curing accelerator is used in an amount of about 0.1 to 1 part by weight based on 100 parts by weight of the binder, and thus it can be used in a lower amount than 5% to 15% by weight described above.

Further, examples of the imidazole-based curing accelerator include an imidazole such as 1-methyl imidazole, 2-methyl imidazole, 2-ethyl 4-methyl imidazole, 2-phenyl imidazole, 2-cyclohexyl 4-methyl imidazole, 4-butyl 5-ethyl imidazole, 2-methyl 5-ethyl imidazole, 2-Phenolphthalein 4-hexyl imidazole, 2,5-dichloro-4-ethyl imidazole, 2-butoxy 4-allyl imidazole, and imidazole derivatives, and 2-methyl imidazole or 2-phenyl imidazole is particularly preferred due to its excellent reaction stability and low cost.

In addition, the thermosetting resin composition of the present invention may further include at least one additive selected from the group consisting of a flame retardant, a lubricant, a dispersant, a plasticizer and a silane coupling agent, which are commonly added as needed. Furthermore, the resin composition of the present invention may further include various high polymer compounds such as other thermosetting resins, thermoplastic resins and oligomers and elastomers thereof, and other salt resistance compounds or additives, as long as the inherent characteristics of the resin composition are not impaired. These are not particularly limited as long as they are selected from those that are commonly used.

<Prepreg>

According to another embodiment of the present invention, a prepreg prepared by impregnating a fiber substrate with the thermosetting resin composition is provided.

The prepreg refers to that in which the thermosetting resin composition is impregnated into the fiber substrate in a semi-cured state.

The fiber substrate is not particularly limited in its type, but a glass fiber substrate, a synthetic fabric substrate made of a woven or nonwoven fabric mainly composed of a polyamide-based resin fiber, such as a polyamide resin fiber, an aromatic polyamide resin fiber, a polyester-based resin fiber such as a polyester resin fiber, an aromatic polyester resin fiber, or a wholly aromatic polyester resin fiber, a polyimide resin fiber, or a fluororesin fiber, etc., and a paper substrate mainly composed of craft paper, cotton linter paper, mixed paper of linter and craft pulp etc. may be used. Preferably, a glass fiber substrate may be used.

In addition, the glass fiber substrate can improve the strength of the prepreg and reduce the absorption rate, and can also reduce the coefficient of thermal expansion. The glass substrate used in the present invention may be selected from glass substrates used for various printed circuit board materials. Examples thereof include glass fibers such as E glass, D glass, S glass, T glass and NE glass, but are not limited thereto.

The glass substrate may be selected according to the intended use or performance, as needed. The glass substrate forms are typically woven, nonwoven, roving, chopped strand mat or surfacing mat.

The thickness of the glass substrate is not particularly limited, but about 0.01 to 0.3 mm, etc. may be used. Among these materials, the glass fiber material is more preferable in terms of the strength and water absorption property.

In addition, in the present invention, the method for preparing the prepreg is not particularly limited, and it may be prepared by a method that is well known in the art. For example, the method for preparing the prepreg includes an impregnation method, a coating method using various coaters, a spraying method, and the like.

In the case of the impregnation method, the prepreg may be prepared by preparing a varnish, followed by impregnating the fiber substrate with the varnish.

That is, the preparation conditions and the like of the prepreg are not particularly limited, but it is preferable that the prepreg is used in a varnish state in which a solvent is added to the thermosetting resin composition. The solvent for the resin varnish is not particularly limited as long as it is miscible with the resin component and has good solubility.

Specific examples thereof include ketones such as acetone, methyl ethyl ketone, methyl isobutyl ketone and cyclohexanone, aromatic hydrocarbons such as benzene, toluene and xylene, amides such as dimethyl formamide and dimethylacetamide, aliphatic alcohols such as methylcellosolve and butylcellosolve, and the like.

Further, it is preferable that at least 80 wt % of the used solvent is volatilized at the time of preparing the prepreg. Therefore, there is no limitation in the preparation method or drying conditions, etc. The temperature at the time of drying may be about 80° C. to 180° C., and the time is not particularly limited due to a balance with a gelation time of the varnish.

Furthermore, it is preferable that the impregnation amount of the varnish is adjusted such that a resin solid content of the varnish becomes about 30 wt % to 80 wt % based on the total amount of the resin solid content of the varnish and the substrate.

<Metal Clad Laminate>

According to still another embodiment of the present invention, a metal clad laminate including the prepreg; and a metal foil integrated with the prepreg by heating and pressurizing is provided.

The metal foil may include a copper foil; an aluminum foil; a composite foil of a three-layer structure having an intermediate layer of nickel, nickel-phosphorus, a nickel-tin alloy, a nickel-iron alloy, lead or a lead-tin alloy, and having copper layers of different thickness on both side; or a composite foil of a two-layer structure composed of aluminum and a copper foil.

According to a preferred embodiment, the metal foil used in the present invention may be a copper foil or an aluminum foil, and it may have a thickness of about 2 μm to 200 μm, but may preferably have a thickness of about 2 μm to 35 μm. Preferably, a copper foil is used as the metal foil. In addition, according to the present invention, as for the metal foil, a composite foil of a three-layer structure having an intermediate layer of nickel, nickel-phosphorus, nickel-tin alloy, nickel-iron alloy, lead or lead-tin alloy, etc. and in which a copper layer of 0.5 μm to 15 μm and a copper layer of 10 μm to 300 μm are provided on both sides thereof, and a composite foil of a two-layer structure composed of aluminum and a copper foil may be used.

At least one metal laminate including the prepreg prepared as described above can be used for manufacturing a double-sided or multilayer printed circuit board after one or more sheets are laminated. According to the present invention, the double-sided or multilayer printed circuit board may be manufactured by processing a circuit on the metal clad laminate, and the circuit may be processed by a method performed in a manufacturing process of a general double-sided or multilayer printed circuit board.

Further, in order to evaluate the flowability of the prepreg, the degree of flow after lamination may be understood by using a 12 μm copper foil with a high roughness of the copper foil and a 2 μm copper foil with a low roughness, respectively. The flowability evaluation method may be carried out by removing the copper foil layer by etching and then visually observing and comparing the amount flowing out to the outside, thereby visually evaluating the surface of the cured prepreg.

As described above, the present invention may be applied to all printed circuit board in various fields and may be preferably used to manufacture a printed circuit board for a semiconductor package by using the thermosetting resin composition described above.

Hereinafter, the present invention will be described in more detail with reference to examples below. However, the examples are only for illustrative purposes and are not intended to limit the scope of the present invention.

Examples and Comparative Examples

The components of the compositions shown in Tables 1 and 2 below were mixed at a speed of 400 rpm in a high-speed stirrer to prepare photosensitive resin compositions (resin varnishes) of Examples 1 to 6 and Comparative Examples 1 to 9.

Then, each resin varnish was impregnated with glass fiber (2118 manufactured by Nittobo, T-glass) having a thickness of 94 μm, and was then dried with hot air at a temperature of 100° C. to 140° C. to prepare a prepreg with a thickness of 100 μm.

Thereafter, after two sheets of the prepreg prepared as described above were laminated, a copper foil (thickness: 12 μm, manufactured by Mitsui) was laminated by positioning on both surfaces thereof, and pressurized to prepare a copper clad laminate.

TABLE 1

|  | Example 1 Rubber 20% | Example 2 Rubber 5% | Example 3 Rubber Mw 30 × 10$^4$ | Example 4 Size of filler 1 μm/50 nm | Example 5 Content of filler 250 phr | Example 6 Filler ratio |
|---|---|---|---|---|---|---|
| Epoxy resin (wt %) | 30 | 30 | 30 | 30 | 30 | 30 |
| BMI resin (wt %) | 25 | 25 | 25 | 25 | 25 | 25 |
| Cyanate ester resin (wt %) | 40 | 40 | 40 | 40 | 40 | 40 |
| Benzoxazine resin (wt %) | 5 | 5 | 5 | 5 | 5 | 5 |
| Acrylic rubber A (parts by weight) | 20 | 5 | — | 20 | 20 | 15 |
| Acrylic rubber B (parts by weight) | — | — | 20 | — | — | — |
| Acrylic rubber C (parts by weight) | — | — | — | — | — | — |
| First inorganic Filler A (parts by weight) | 315 | 315 | 315 | — | 225 | 280 |
| Second inorganic Filler B (parts by weight) | 35 | 35 | 35 | 35 | 25 | 70 |
| First inorganic Filler C (parts by weight) | — | — | — | 315 | — | — |
| First inorganic Filler D (parts by weight) | — | — | — | — | — | — |
| Second inorganic Filler E (parts by weight) | — | — | — | — | — | — |
| First inorganic Filler (parts by weight) | — | — | — | — | — | — |
| First inorganic Filler G (parts by weight) | — | — | — | — | — | — |

TABLE 2

|  | Comp. Ex. 1 Rubber 0% | Comp. Ex. 2 First inorganic filler: Surface treatment(epoxy) | Comp. Ex. 3 CE 0% | Comp. Ex. 4 Rubber 30% | Comp. Ex. 5 Rubber Mw 85 × 10$^4$ | Comp. Ex. 6 Filler size 0.5 μm/100 nm | Comp. Ex. 7 Surface treatment (phenyl) | Comp. Ex. 8 Surface treatment (phenylamino) | Comp. Ex. 9 Singles filler used |
|---|---|---|---|---|---|---|---|---|---|
| Epoxy resin (wt %) | 30 | 30 | 50 | 30 | 30 | 30 | 30 | 30 | 30 |

TABLE 2-continued

| | Comp. Ex. 1 Rubber 0% | Comp. Ex. 2 First inorganic filler: Surface treatment(epoxy) | Comp. Ex. 3 CE 0% | Comp. Ex. 4 Rubber 30% | Comp. Ex. 5 Rubber Mw 85 × 10$^4$ | Comp. Ex. 6 Filler size 0.5 μm/100 nm | Comp. Ex. 7 Surface treatment (phenyl) | Comp. Ex. 8 Surface treatment (phenylamino) | Comp. Ex. 9 9 Singles filler used |
|---|---|---|---|---|---|---|---|---|---|
| BMI resin (wt %) | 25 | 25 | 45 | 25 | 25 | 25 | 25 | 25 | 25 |
| Cyanate ester resin (wt %) | 40 | 40 | — | 40 | 40 | 40 | 40 | 40 | 40 |
| Benzoxazine resin (wt %) | 5 | 5 | 5 | 5 | 5 | 5 | 5 | 5 | 5 |
| Acrylbased rubber A (parts by weight) | 0 | 20 | 20 | 30 | — | 20 | 20 | 20 | 20 |
| Acrylbased rubber B (parts by weight) | — | — | — | — | — | — | — | — | — |
| Acrylbased rubber C (parts by weight) | — | — | — | — | 20 | — | — | — | — |
| First inorganic Filler A (parts by weight) | 315 | — | 315 | 315 | 315 | 315 | — | — | 350 |
| Second inorganic Filler B (parts by weight) | 35 | 35 | 35 | 35 | 35 | — | 25 | 25 | — |
| First inorganic Filler C (parts by weight) | — | — | — | — | — | — | — | — | — |
| First inorganic Filler D (parts by weight) | — | 315 | — | — | — | — | — | — | — |
| Second organic Filler E (parts by weight) | — | — | — | — | — | 35 | — | — | — |
| First inorganic Filler F (parts by weight) | — | — | — | — | — | — | 225 | — | — |
| First inorganic Filler G (parts by weight) | — | — | — | — | — | — | — | 225 | — |

Note)
Epoxy resin: Naphthalene-based epoxy resin (HP4710, DIC)
BMI resin: Bismaleimide-based resin (BMI-2300, DAIWA)
Cyanate ester resin: Novolac type cyanate resin (PT-30S, Lonza)
Benzoxazine resin: Phenolphthalien benzoxazine resin (XU8282, Hunstman)
BT resin: (Nanozine 600, Nanokor)
Acrylic rubber A: SG-P3-PT197 (Mw 65 × 10$^4$, Tg: 12° C.), Nagase Chemtex Corporation
Acrylic rubber B: SG-P3-MW1 (Mw 30 × 10$^4$, Tg: 12° C.), Nagase Chemtex Corporation
Acrylic rubber C: SG-P3 (Mw 85 × 10$^4$, Tg: 12° C.), Nagase Chemtex Corporation
Filler A: Methacryl silane-treated slurry type filler, average particle diameter of 0.5 μm (SC2050MTM, Admantechs)
Filler B: Methacryl silane-treated slurry type filler, average particle diameter of 50 nm (YA050C-MJE, Admantechs)
Filler C: Methacryl silane-treated powder type filler, average particle diameter of 1 μm (SFP-130MCMA, Denka)
Filler D: Epoxy silane-treated slurry type filler, average particle diameter of 0.5 μm (SC2050MTE, Admantechs)
Filler E: Methacryl silane-treated slurry type filler, average particle diameter of 100 nm (MEK-AC-5140Z, Nissan Chemical)
Filler F: Phenylsilane-treated slurry type filler, average particle diameter of 0.5 μm (SC2050MTI, Admantechs)
Filler G: Phenylaminosilane-treated slurry type filler, average particle diameter of 0.5 μm (SC2050MTO, Admantechs)

Experimental Examples

The physical properties of the copper-clad laminates prepared in Examples and Comparative Examples were measured by the following methods:

(1) Resin Flow (RF)

According to IPC-TM-650 (2.3.17), RF was measured using a cover press in the prepreg state.

(2) Moldability (Presence or Absence of Void)

The cross-section of the copper clad laminate was made from specimens for observation. The moldability was evaluated by examining the presence or absence of voids through a scanning electron microscope.

(3) Glass Transition Temperature (Tg)

After removing the copper foil of the copper clad laminate by etching, the glass transition temperature was measured by DMA and TMA.

(4) Modulus

After removing the copper foil of the copper clad laminate by etching, the modulus was measured by DMA.

(5) Coefficient of Thermal Expansion (CTE)

After removing the copper foil of the copper clad laminate by etching, the CTE was measured by TMA.

(6) Shrinkage

After removing the copper foil of the copper clad laminate by etching, the shrinkage was measured by TMA. The difference in dimensional change was confirmed through heating→cooling processes.

(7) Evaluation of Chemical Resistance (Desmear)

In the desmear evaluation, the atmosphere of the entire process conditions was alkaline, and processes were performed in a sequence of swelling process, permanagement and neutralizing process. As for a solution, a commercially available solution manufactured by Atotech was used.

The evaluation was carried out by removing the copper foil of the copper clad laminate by etching and then measuring a difference (etching rate) in the weight of the sample before and after the desmear process.

The results of the evaluation above are summarized in Tables 3 and 4 below.

TABLE 3

| | Example 1 Rubber 20% | Example 2 Rubber 5% | Example 3 Rubber Mw $30 \times 10^4$ | Example 4 Filler size 1 μm/50 nm | Example 5 Content of filler 250 phr | Example 6 Filler ratio |
|---|---|---|---|---|---|---|
| Resin flow (%) | 5 | 5 | 5 | 5 | 7 | 5 |
| Moldability (Presence or absence of void) | Absent | Absent | Absent | Absent | Absent | Absent |
| Tg(° C., DMA) | 310 | 310 | 310 | 310 | 310 | 310 |
| Tg(° C., TMA) | 270 | 270 | 270 | 270 | 270 | 270 |
| Modulus (Gpa, 30/260° C.) | 34/27 | 37/30 | 34/27 | 34/27 | 33/26 | 34/27 |
| CTE (50-150° C.) (pp/° C.) | 1.8 | 1.8 | 1.8 | 1.8 | 3.0 | 1.8 |
| Shrinkage (%) | −0.01 | −0.01 | −0.01 | −0.01 | −0.02 | −0.01 |
| Desmear (g/50 cm$^2$) | 0.002 | 0.002 | 0.002 | 0.007 | 0.003 | 0.002 |

TABLE 4

| | Comp. Ex. 1 Rubber 0% | Comp. Ex. 2 Surface treatment (epoxy) | Comp. Ex. 3 CE 0% | Comp. Ex. 4 Rubber 30% | Comp. Ex. 5 Rubber Mw $85 \times 10^4$ | Comp. Ex. 6 Filler size 0.5 μm/100 nm | Comp. Ex. 7 Surface treatment (phenyl) | Comp. Ex. 8 Surface treatment (phenylamino) | Comp. Ex. 9 Single filler used |
|---|---|---|---|---|---|---|---|---|---|
| Resin flow (%) | 5 | 0 | 0 | 0 | 0 | 0 | 0 | 0 | 0 |
| Moldability (Presence or absence of void) | Absent | Present | Present | Present | Present | Present | Present | Present | Present |
| Tg (° C., DMA) | 310 | 310 | 280 | 310 | 310 | 310 | 310 | 310 | 310 |
| Tg (° C., TMA) | 270 | 270 | 240 | 270 | 270 | 270 | 270 | 270 | 270 |
| Modulus (Gpa, 30/260° C.) | 38/31 | 34/27 | 30/23 | 28/21 | 34/27 | 34/27 | 33/26 | 33/26 | 34/27 |
| CTE (50-150° C.) (pp/° C.) | 2.0 | 2.0 | 2.0 | 2.5 | 2.0 | 2.0 | 3.0 | 3.0 | 2.0 |
| Shrinkage (%) | −0.2 | −0.05 | −0.2 | −0.05 | −0.1 | −0.05 | −0.05 | −0.05 | −0.1 |
| Desmear (g/50 cm$^2$) | 0.01 | 0.015 | 0.01 | 0.005 | 0.005 | 0.005 | 0.01 | 0.015 | 0.005 |

As shown in Tables 3 and 4, Examples 1 to 6 of the present invention were generally excellent in physical properties as compared with Comparative Examples 1 to 9.

In particular, Examples 1 to 6 of the present invention used the acrylic rubber having specific parameter properties, and showed very low shrinkage of −0.01% or less as the first and second inorganic fillers having different particle diameters whose surfaces are all treated with a (meth)acrylate silane compound were used by mixing in a constant ratio. In addition, the present invention exhibited a high glass transition temperature, thereby improving the resin flow, and can improve the moldability due to the absence of voids, and also showed excellent CTE and desmear properties.

However, in Comparative Examples 1 to 9, although the glass transition temperature was of an equivalent level to the present invention, since the specific acrylic rubber was not used or the range of use of the filler is not applicable to the present invention, the physical properties such as modulus, coefficient of thermal expansion (CTE), cure shrinkage, and the like were generally poor.

That is, even if Comparative Example 1 exhibited a certain degree of resin flowability and moldability as compared with the present invention, there was a problem that the quality of the final molded product was deteriorated since the coefficient of thermal expansion, the cure shrinkage and the desmear were high.

In addition, Comparative Examples 2, 3, and 6 to 9 include the acrylic rubber of the present application and thereby show a similar glass transition temperature to that of the present invention, but the flowability was poor and the cure shrinkage was poor because of using a filler having a condition different from that of the present invention. Further, voids occurred, the moldability was poor, the coefficient of thermal expansion was high, and the desmear was generally high, thereby degrading the chemical resistance. At this time, in Comparative Example 3, there was a problem that the cyanate resin was not included in the binder component, and thus the glass transition temperature and the modulus were all low.

In addition, in Comparative Example 4, the content of the acrylic rubber was too high, and the coefficient of thermal expansion and the cure shrinkage were higher than in the present invention, resulting in a problem of poor flowability as well as poor moldability.

Also in Comparative Example 5, since the molecular weight range of the acrylic rubber was not included in the present invention, the coefficient of thermal expansion, the cure shrinkage, the flowability and the moldability were poorer than in the present invention.

From these results, it can be seen that a high glass transition temperature and low cure shrinkage can be exhibited only when a mixture of an acrylic rubber having specific parameter properties and an inorganic filler having other inorganic particle sizes surface-treated by a specific method as in the present invention is used. In addition, in this case, it was confirmed that the coefficient of thermal expansion can be smaller than that of the conventional resin, the resin flowability and moldability are excellent, and the chemical resistance and modulus characteristics are also excellent.

The invention claimed is:

1. A thermosetting resin composition for a semiconductor package, wherein the thermosetting resin composition comprises:

5 to 20 parts by weight of an acrylic rubber and 160 to 350 parts by weight of a filler, based on 100 parts by weight of a binder including an epoxy resin, a bismaleimide resin, a cyanate resin and a benzoxazine resin, wherein the acrylic rubber has a weight average molecular weight of $30 \times 10^4$ to $65 \times 10^4$, a viscosity of 1,000 to 6,000 mPa·s, and a glass transition temperature of 10° C. to 50° C., and wherein the filler is at least one mixture including a first inorganic filler having an average particle diameter of 0.2 μm to 1 μm in which a (meth)acrylate silane compound is bonded to the surface of the first inorganic filler, and a second inorganic filler having an average particle diameter of 20 nm to 50 nm in which a (meth)acrylate silane compound is bonded to the surface of the second inorganic filler.

2. The thermosetting resin composition for a semiconductor package according to claim 1, wherein the acrylic rubber is an acrylic acid ester copolymer containing a repeating unit derived from butyl acrylate and a repeating unit derived from acrylonitrile; or an acrylic acid ester copolymer containing a repeating unit derived from butadiene.

3. The thermosetting resin composition for a semiconductor package according to claim 1, wherein the acrylic rubber further includes a repeating unit derived from an alkyl acrylate having a linear or branched alkyl group having 2 to 10 carbon atoms.

4. The thermosetting resin composition for a semiconductor package according to claim 1, wherein the filler includes the first inorganic filler having an average particle diameter of 0.2 μm to 1 μm and the second inorganic filler having an average particle size of 20 nm to 50 nm in a weight ratio of 10:90 to 90:10 based on the total weight of the entire surface-treated filler.

5. The thermosetting resin composition for a semiconductor package according to claim 1, wherein the binder includes 20% to 60% by weight of the epoxy resin, 20% to 70% by weight of the bismaleimide resin, 30% to 70% by weight of the cyanate resin, and 2% to 10% by weight of the benzoxazine resin.

6. The thermosetting resin composition for a semiconductor package according to claim 1, wherein the benzoxazine resin is at least one selected from the group consisting of a bisphenol A benzoxazine resin, a bisphenol F benzoxazine resin, a phenolphthalein benzoxazine resin, and a mixture of these benzoxazine resins and a curing accelerator.

7. The thermosetting resin composition for a semiconductor package according to claim 1, wherein each of the first inorganic filler and the second inorganic filler is at least one selected from the group consisting of silica aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, fine glass powder, and hollow glass.

8. The thermosetting resin composition for a semiconductor package according to claim 1, wherein the epoxy resin is at least one selected from the group consisting of a bisphenol A epoxy resin, a phenol novolac epoxy resin, a tetraphenyl ethane epoxy resin, a naphthalene epoxy resin, a biphenyl epoxy resin, a dicyclopentadiene epoxy resin, and a mixture of a dicyclopentadiene epoxy resin and a naphthalene epoxy resin.

9. The thermosetting resin composition for a semiconductor package according to claim 1, wherein the bismaleimide resin is at least one selected from the group consisting of compounds represented by the following Chemical Formula 2;

[Chemical Formula 2]

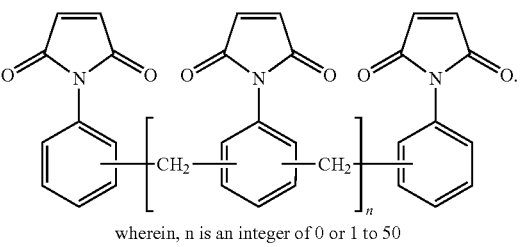

wherein, n is an integer of 0 or 1 to 50

10. The thermosetting resin composition for a semiconductor package according to claim 1, wherein the cyanate resin is at least one selected from the group consisting of compounds represented by the following Chemical Formula 3;

[Chemical Formula 3]

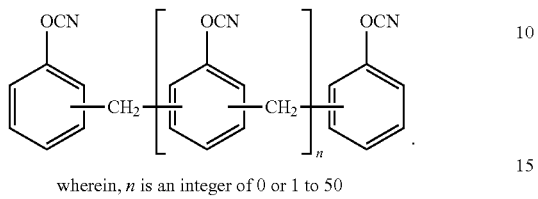

wherein, n is an integer of 0 or 1 to 50

11. The thermosetting resin composition for a semiconductor package according to claim 1, further comprising at least one additive selected from the group consisting of a solvent, a curing accelerator, a flame retardant, a lubricant, a dispersant, a plasticizer and a silane coupling agent.

12. A prepreg obtained by impregnating a fiber substrate with the thermosetting resin composition according to claim 1.

* * * * *